United States Patent [19]
Gleim

[11] Patent Number: 5,270,716
[45] Date of Patent: Dec. 14, 1993

[54] DIGITAL-TO-ANALOG CONVERTER WITH HIGH LINEARITY

[75] Inventor: Günter Gleim, Villingen, Fed. Rep. of Germany

[73] Assignee: Deutsche Thomson-Brandt GmbH, Fed. Rep. of Germany

[21] Appl. No.: 792,873

[22] Filed: Nov. 18, 1991

[30] Foreign Application Priority Data

May 18, 1989 [DE] Fed. Rep. of Germany ....... 3916202

[51] Int. Cl.$^5$ .......................... H03M 1/68; H03M 1/06
[52] U.S. Cl. ...................... 341/145; 341/118
[58] Field of Search ........................ 341/118, 144, 145

[56] References Cited
U.S. PATENT DOCUMENTS

| | | | |
|---|---|---|---|
| 3,995,266 | 11/1976 | Müller et al. | 341/145 |
| 4,016,555 | 4/1977 | Tyrrel | 341/145 |
| 4,410,879 | 10/1983 | Gumm et al. | 341/145 |
| 4,538,266 | 8/1985 | Miki | 341/118 |

FOREIGN PATENT DOCUMENTS

| | | |
|---|---|---|
| 3025932 | 2/1982 | Fed. Rep. of Germany . |
| 60-185429 | 9/1985 | Japan ................... 341/144 |

*Primary Examiner*—Howard L. Williams
*Attorney, Agent, or Firm*—Joseph S. Tripoli; Eric P. Herrmann; Ronald H. Kurdyla

[57] ABSTRACT

A high linearity digital-to-analog converter (D/A) provides a linear output voltage using two D/A's. One D/A provides a number of coarse steps and another D/A increments the output voltage within the coarse steps using fine steps. Discontinuities in the output voltage caused by the changing from one coarse step to another are avoided by using reference voltages which ensure that the initial voltage available at the start of a coarse step is lower than the final voltage available at the end of the preceeding step.

1 Claim, 6 Drawing Sheets

DIGITAL-TO-ANALOG CONVERTER WITH HIGH LINEARITY

This is a continuation of PCT application PCT/EP 90/00750 filed May 10, 1990 by Gunter Gleim and titled "HIGH LINEARITY D/A CONVERTER".

This invention is directed to a circuit and method for converting a digital input variable into an analog output variable by means of a digital-to-analog converter.

The coverage of a broad quantizing range with a digital-to-analog (D/A) converter requires the converter to be designed for a high number of bits. The costs of such digital-to-analog converters are high. To cut costs it is known to use D/A converters which are not capable of processing broad quantizing ranges. A broadened range is achieved by using one digital-to-analog converter to vary the output voltage in fine gradations within a specific coarse quantizing range. A second D/A provides a number of coarse quantizing ranges whereby the output voltage is gradually changed within the coarse range by the fine gradations provided by the first D/A. Because of the tolerances of the components in the D/A converters, the various voltage sources used for the fine and coarse adjustments of the analog output signal, and also because of temperature changes and aging, the value of the first step of the succeeding coarse range rarely corresponds to the value of the last step of the preceding coarse range. Such a difference in successive coarse step ranges can cause a discontinuity in what should be a continuous voltage output.

A prior art circuit for automatic station searching modifies the tuning voltage in coarse digital ranges while changing the tuning voltage range of the coarse ranges using fine voltage steps. At the end of each coarse range the next succeeding coarse range is initiated. The low voltage, or start, of the succeeding range can be higher than the last set value of the preceding coarse range and therefore some fine steps of the tuning voltages in the succeeding range can be missed. Therefore, in the prior circuit arrangement, the low voltage of the succeeding coarse range is selected to be lower than the highest voltage of the preceding coarse range and the possibility of some fine tuning steps and stations, being missed, or passed over, is eliminated. However, this technique does not prevent the occurrence of discontinuities in the output voltage where the changes between coarse ranges take place. In a station search system a discontinuity in the output may not be detrimental. However, in many systems, such as a sound reproduction system, this sort of discontinunity, for example, can be very disturbing.

U.S. Pat. No. 4,410,879 describes a system for expanding the resolution of a digital-to-analog converter which uses two D/A converters connected in tandem. The first D/A processes the lower value bits and the second D/A processes the higher value bits. The outputs of the two D/A converters are input to a summing amplifier. The output of a scanning circuit is coupled to an integrating amplifier, which supplies a signal to the negative input of the summing amplifier in an attempt to keep the output of the summing amplifier at a constant zero value. When the lower value converter attains its highest value, the output of the summing amplifier is disconnected from the input of the integrating amplifier and the higher value converter is raised up by one step, while the lower value converter is set to zero. During the change-over the last value of the analog output is maintained.

U.S. Pat. No. 3,995,266 also shows the generation of a control voltage which is varied in coarse and fine steps using two digital-to-analog converters.

Figure 1:
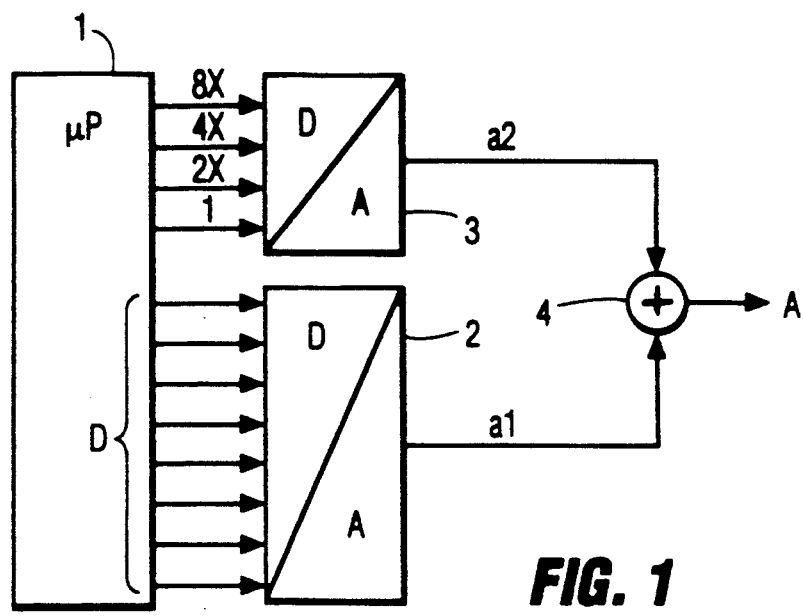
FIG. 1 is a prior art digital to analog converter.
Figure 2:
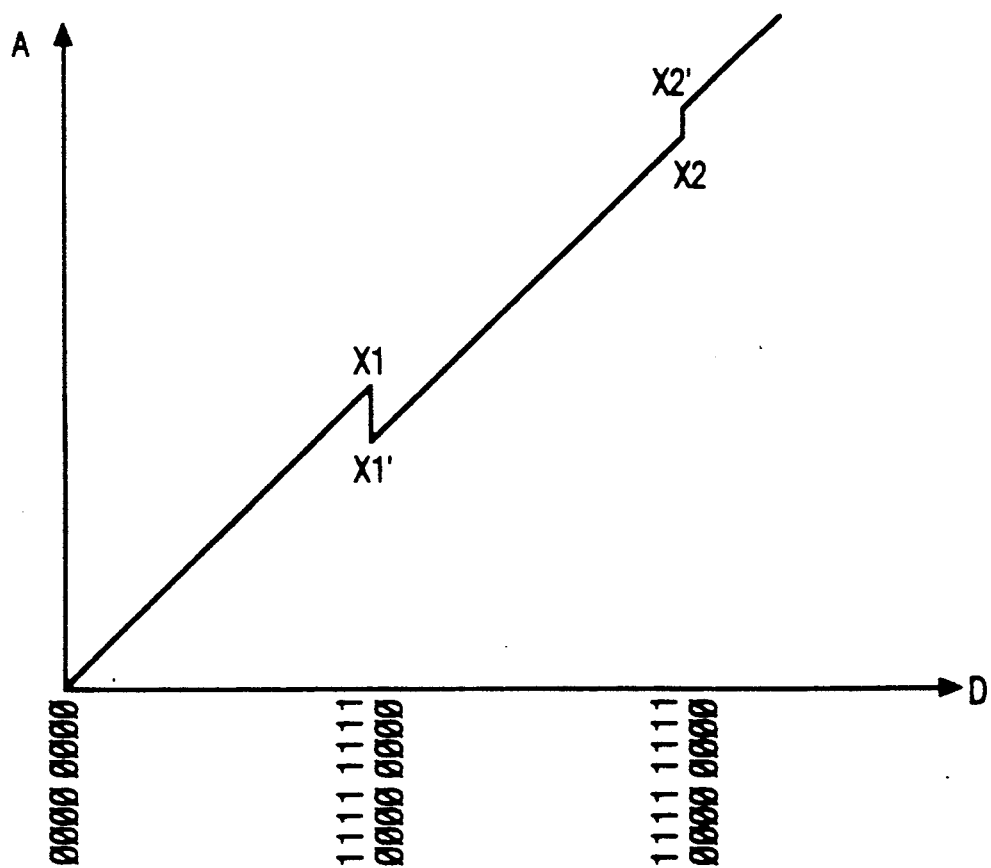
FIG. 2 shows the output voltage of the D/A of FIG. 1.

FIGS. 1 and 2, respectively, show a prior art D/A converter and the output voltage thereof. A control circuit, for example a microprocessor, 1 provides a binary signal which is incremented in digital steps from 0000 0000 through 1111 1111 on output terminals D. The digital signal from output terminals D is input to a fine-step digital-to-analog converter 2. The analog output signal, which changes in fine steps, is available on output terminal a1 of D/A converter 2. A coarse step A/D 3 receives coarse step binary signals from microprocessor 1. When the digital value 1111 1111 of D/A 2 is reached, in order to further increase in the output signal, the microprocessor 1 switches the output terminals back to 0000 0000 and also switches D/A 3 to the next higher coarse step. The output signals a1 and a2 of the D/A's 2 and 3, respectively, are input to a summation stage 4, the output A of which is the desired analog signal. The exemplarily digital-to-analog converter 3 is a four-bit converter and thus is capable of generating sixteen coarse tuning voltage on output terminal a2. The digital-to-analog converter 2 has 8 input terminals D and thus is capable of providing 256 fine tuning voltages on output terminal a1. Accordingly, the sixteen coarse tuning steps provided by D/A 3 are finely incremented by the 256 fine gradations provided by D/A 2.

As shown in FIG. 2, discontinuities can result at the transition points between successive coarse tunings because the last voltage of the fine step may not correspond precisely to the low voltage of next succeeding coarse tuning step. Such discontinuities can result in signal decreases, as shown by the decrease from X1 to X1', or as signal increases, as shown by the increase from X2 to X2'. Such signal discontinuities are undesirable for the reasons stated above.

Discontinuities of the type shown in FIG. 2 are eliminated by the preferred embodiment shown in FIG. 3, the mode of operation of which is described with reference to FIGS. 4, 4a and 4b. Assuming that three reference voltages S1 through S3 are to be employed, three comparators K1, K2 and K3 receive the output signal from the output terminal A. The comparators compare the output voltage from output terminal to the various reference voltages S1, S2, and S3. The reference voltages can be generated by a voltage divider, consisting of the resistors W1, W2, W3 and W4, connected to a fixed reference voltage U. However, they can also be generated using a digital-to-analog conveter. The reference voltage S, must be less than the highest coarse incremented voltage which is provided by D/A 3 at approximately the same time that the digital input 1111 1111 is input to the digital-to-analog converter 2 at the end of the nth coarse step, and must also be above the voltage which the digital input 0000 0000 provides to the digital-to-analog converter 2 at the $n+1^{th}$ coarse step. This results in an overlap range having a value B (FIG. 4). When the output voltage on terminal A exceeds one of the reference values S1, S2 or S3, the appropriate comparator K1, K2 or K3 sends a signal to the microprocessor 1, which thereupon initiates the next coarse step and simultaneously applies an offset voltage to the D/A 2.

Figure 3:
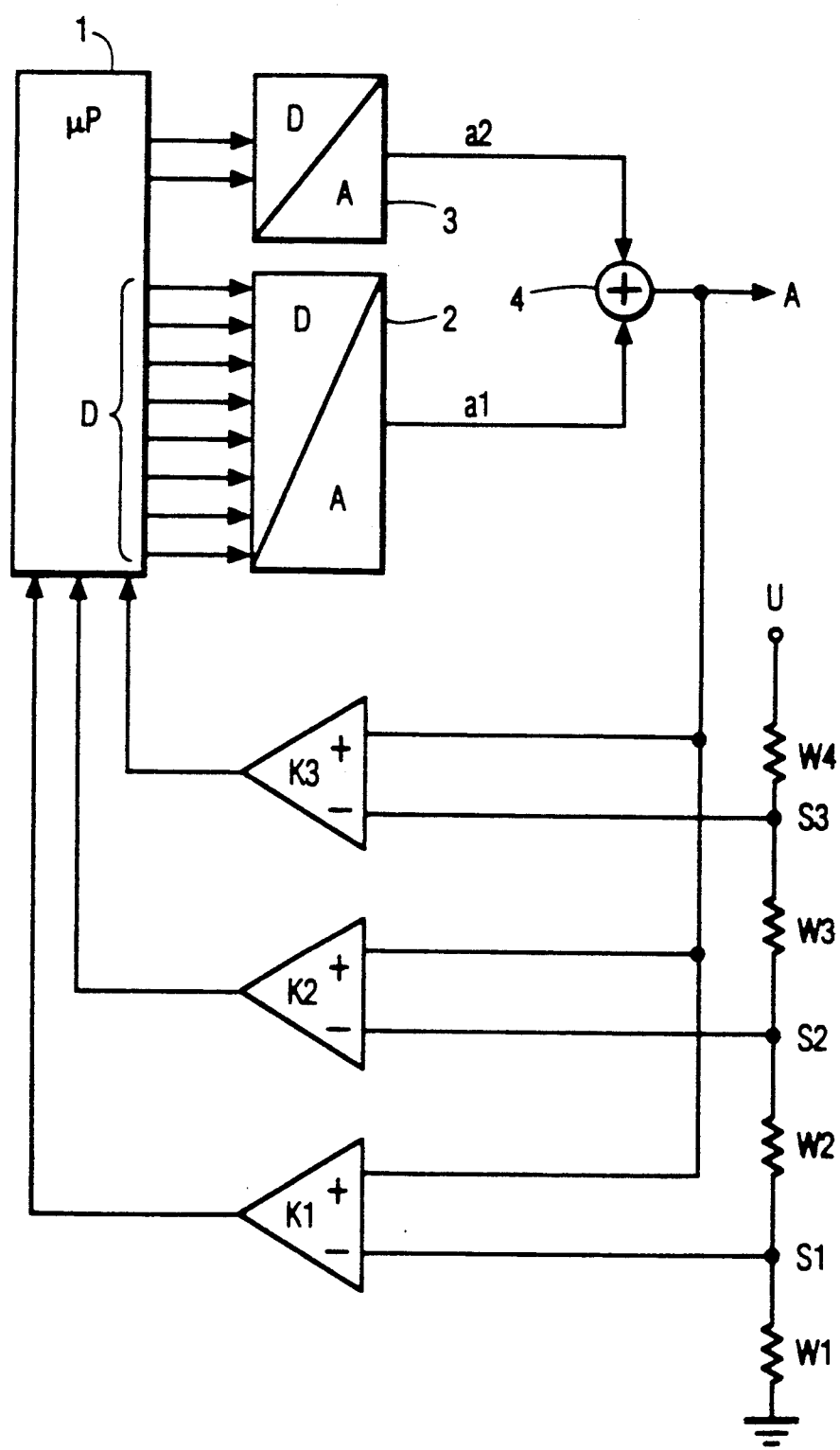
FIG. 3 is a preferred embodiment.
Figure 4:
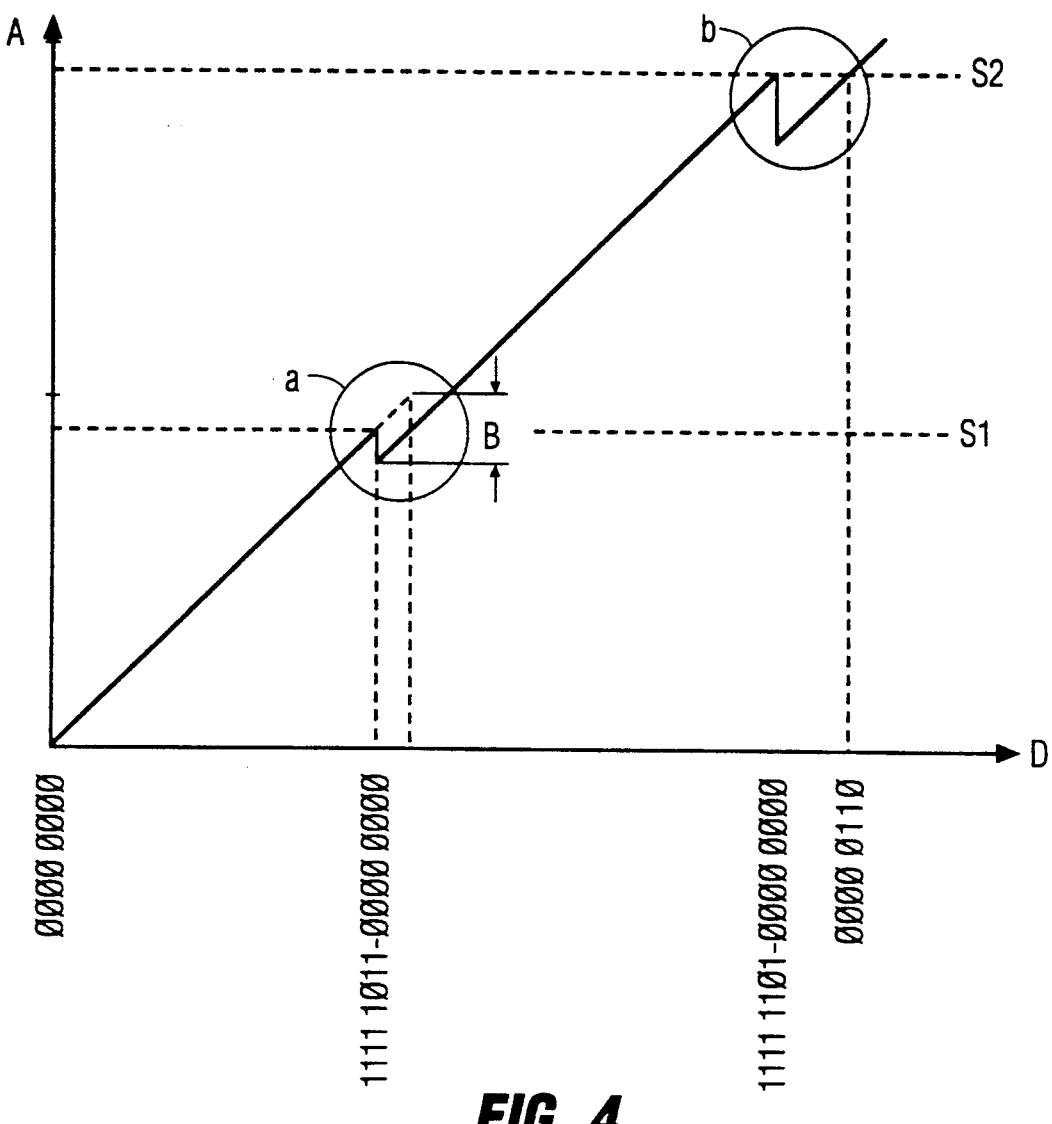
FIGS. 4, 4a and 4b are useful in understanding the operation of the preferred embodiment of FIG. 3.
Figure 4A:
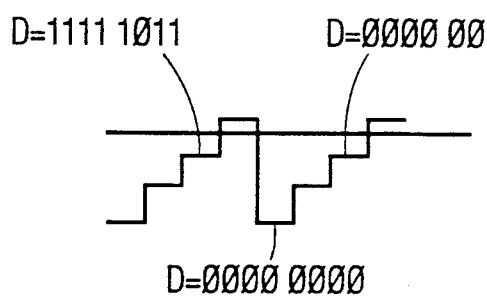
Figure 4B:
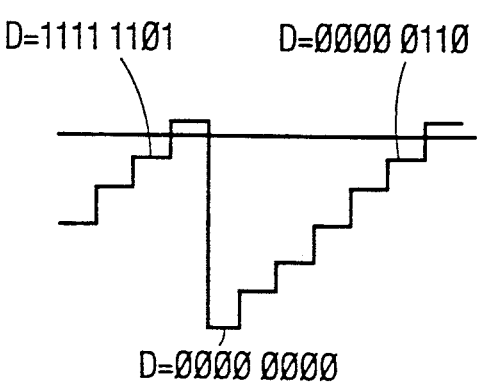
Figure 5:
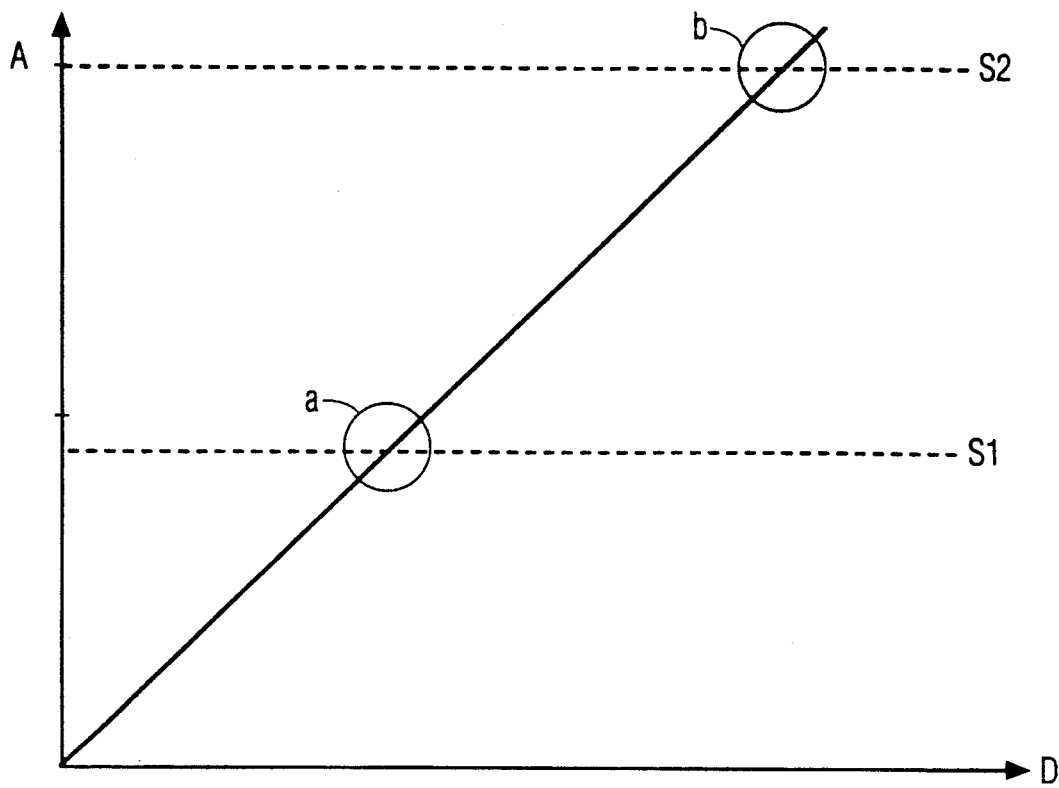
FIGS. 5, 5a and 5b are also useful in understanding the operation of the preferred embodiment of FIG. 3.
Figure 5A:
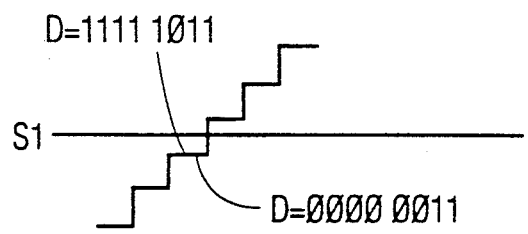
Figure 5B:
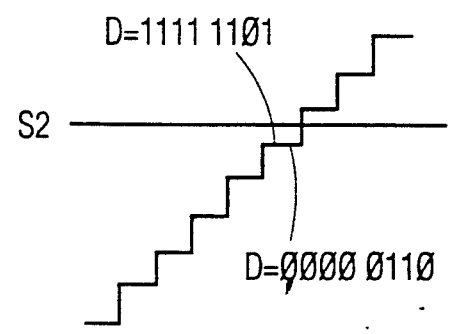

FIGS. 4, 4a and 4b are useful in understanding the operation of the embodiment of FIG. 3. Assume that the output terminals D of the microprocessor 1 are digitally incremented in a known manner starting with the value 0000 0000. Prior to the digital signal reaching the final value 1111 1111 during the first coarse step, the signal on the output terminal A will reach the reference value S1 which, for example, can be set to correspond to the voltage provided by D/A 2 for the digital signal 1111 1011. This voltage value, or the difference between this value and the final value, is stored as an offset number in a memory of the microprocessor 1. At the same time, the output D terminals are set to 0000 0000 and the succeeding coarse step, the lowest value of which should lie below the threshold value S1, is commenced. The digital-to-analog converter 2 is again incremented until the reference value S1 is reached again. This digital value, for example, 0000 0011, is also stored as an offset number. For clarity, this point of the curve is illustrated in enlarged form in FIG. 4a. The difference between the two stored values is the first offset value. Incrementing continues until the reference voltage S2, within the first coarse step, is reached. The reference voltage S2 can correspond to the digital input signal 1111 1101, this value is also stored. Once again, the difference between this value and the final value may be stored. When the digital input signal is set to zero the second coarse step is commenced and the digital-to-analog converter 2 is incremented until the reference value S2 is reached again, for example, with the digital input value 0000 0110, which is again stored. This moment is illustrated in enlarged form in FIG. 4b. The difference between these two stored values is the second offset value. The output voltage of the digital-to-analog converter 2, resulting from the initial calibration and storing, is illustrated in FIG. 5. It can be clearly seen that there are no longer any discontinuities at the voltages where change-overs between coarse increments occur.

Figure 6:
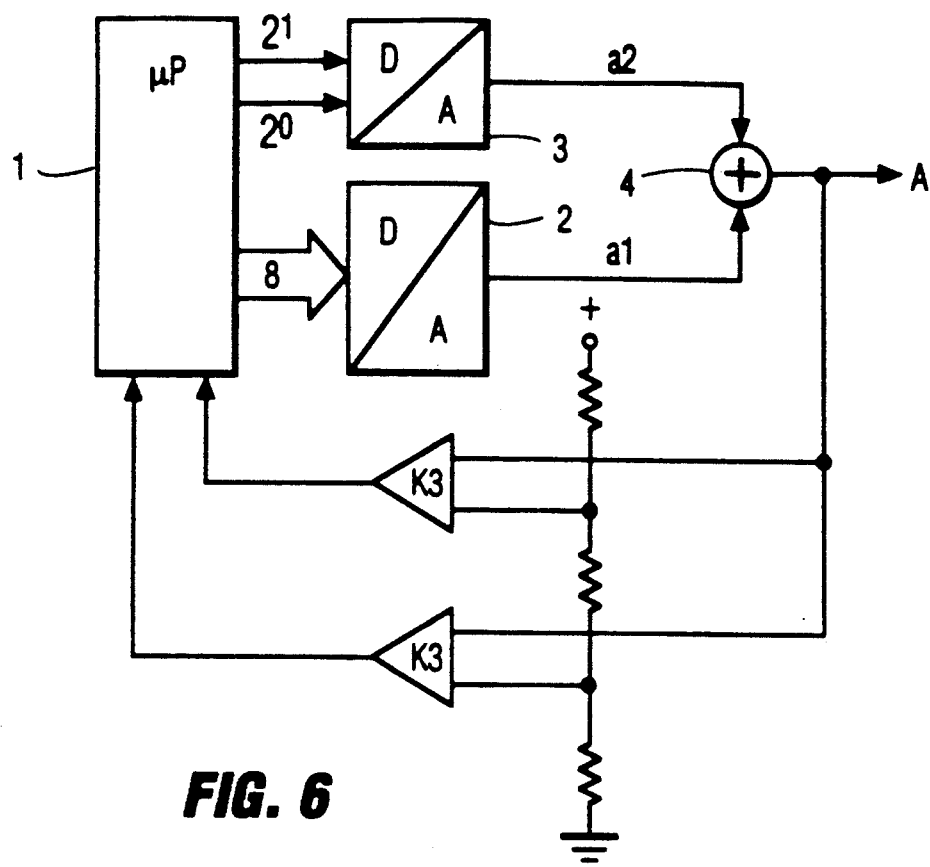
FIG. 6 is a simplified showing of another preferred embodiment.

An embodiment using three coarse steps is shown in FIG. 6. With this embodiment two bits are required for the coarse digital-to-analog converter 3. The first $(2^0)^{th}$ step extends from zero to the threshold value S1, the second $(2^1)^{th}$ step extends from the threshold value S1 to the threshold value S2, the third $(2^0+2^1)^{th}$ step extends from the threshold value S2 to the threshold value S3 and the fourth $(2^2)^{th}$ step begins at the threshold value S3. The generation of the offset values for the digital-to-analog converter 2 for the transition to a next coarse step is carried out by storing these values according to the priorities of the triggering for the digital-to-analog converter 3, so that when a coarse step is initiated the appropriate offset value is adjusted.

Figure 7:
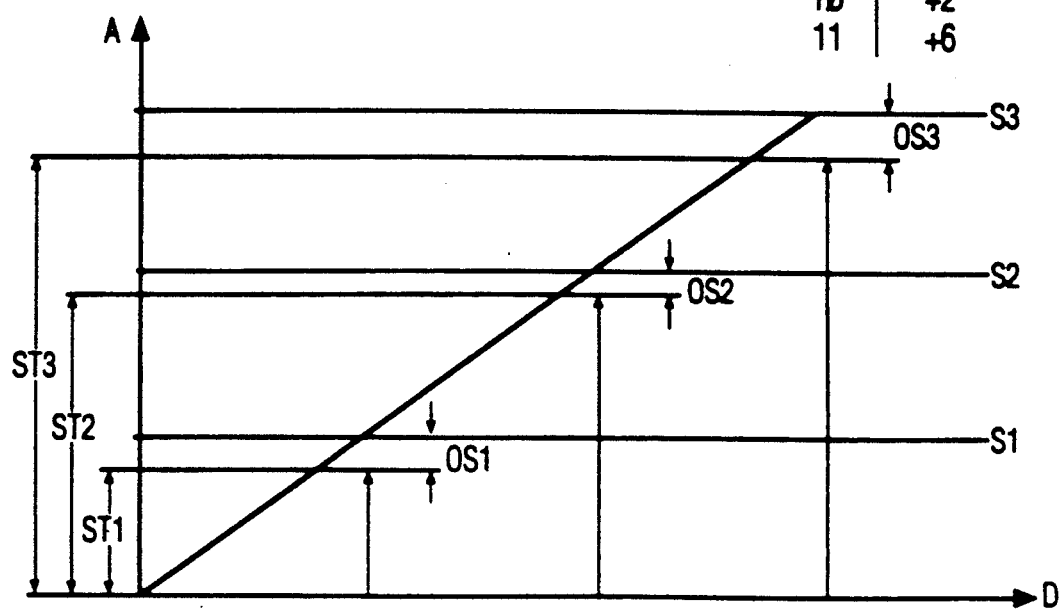
FIG. 7 is useful in understanding the operation of the circuit shown in FIG. 6.

The operation of the FIG. 6 embodiment is explained with reference to FIG. 7. With the first $(2^0)^{th}$ coarse step ST1, the offset value 0 is applied to the digital-to-analog converter 2. Upon reaching the first threshold value S1 for switching over to the second $(2^1)^{th}$ coarse step ST2, the offset value OS1 will be +4 for example. When the third coarse step ST3 reaches the second threshold value S2 the offset value will be +2, for example. When the third threshold value S3 for switching to the fourth coarse step ST4 is reached the stored offset value OS2 (+4), of the second coarse step ST2, is added to the offset value OS3 (+2), of the third coarse step, and the new offset value OS3 is +6.

Figure 8:
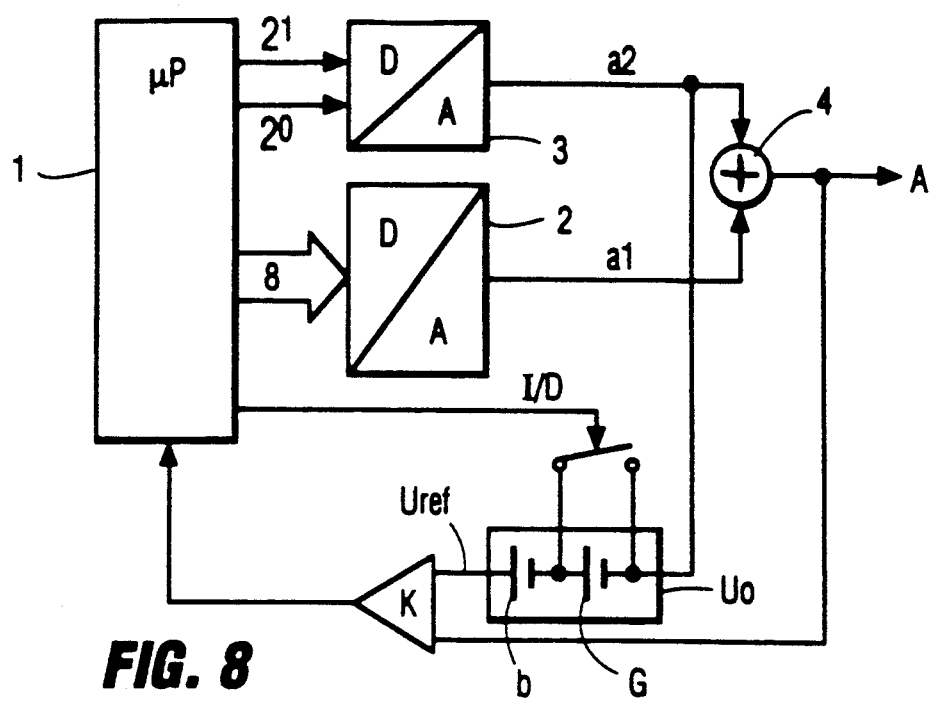
FIG. 8 is another preferred embodiment of the invention.

FIG. 8 is an embodiment of a D/A converter which eliminates discontinuities in the output voltage using only one comparator K. The first input terminal of the comparator is fed with the analog output voltage present on output terminal A of adder 4. The second input terminal receives an offset voltage from the output terminal a2 of digital-to-analog converter 3, which is raised by a fixed offset voltage Uo.

Figure 9:
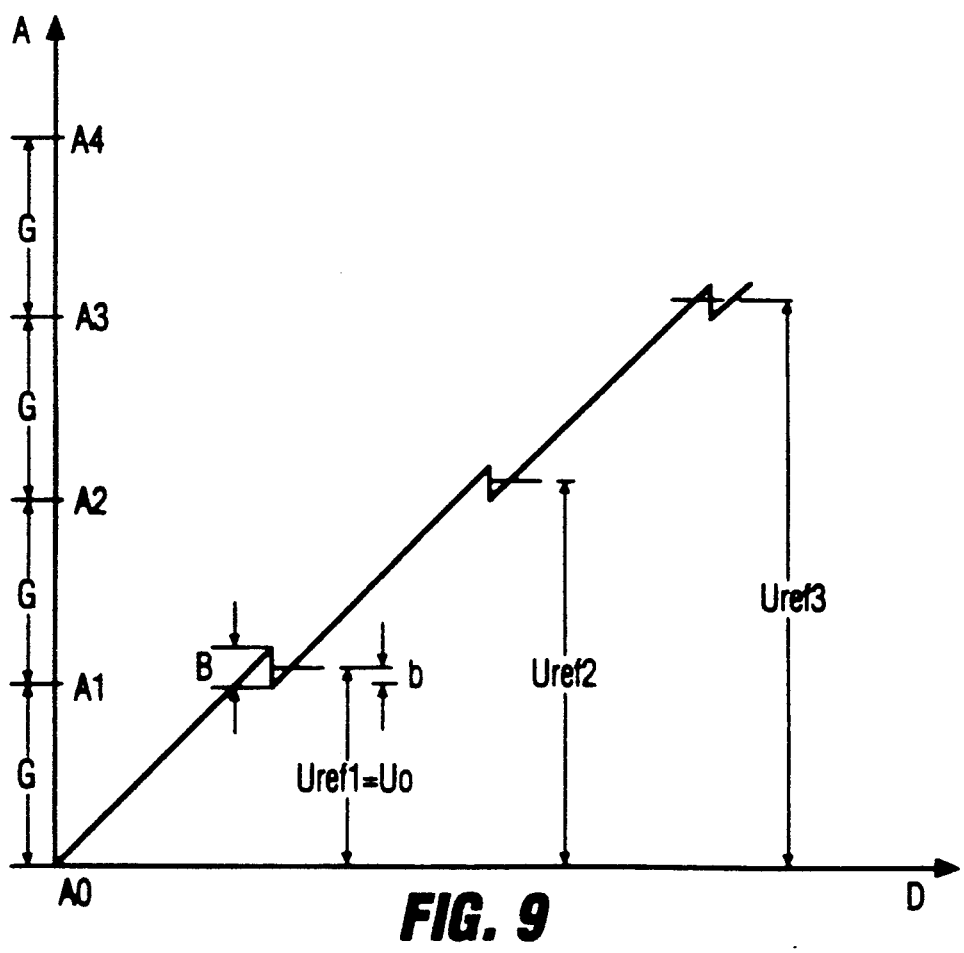
FIG. 9 is useful in understanding the operation of the circuit shown in FIG. 8.

The operation of the FIG. 8 embodiment is explained with reference to FIG. 9, which shows the curve of the analog output variable A dependent upon a digital input value. As in the other embodiments, coarse steps A0, A1, A2, A3 are generated by the digital-to-analog converter 3 and the fine steps taken within the coarse steps are generated by the digital-to-analog converter 2. The first coarse step begins with the value A0, the second coarse step begins with the value A1, etc. The voltage range of a coarse step is G. When the D/A 3 starts a coarse step the digital-to-analog converter 2 supplies its minimum value, for example, zero. The threshold values Uref1 through Uref3 each lie between the maximum analog value that can be attained from the digital-to-analog converter 2 within a coarse step n, and the value which corresponds to the start of an adjacent coarse step (n+1), after the digital-to-analog converter 2 has been set to zero. The threshold values Uref are each generated by raising them by the offset voltage Uo to the value of a coarse step n. Accordingly, the magnitude of offset voltage is Uo is determined by the magnitude of the voltage range G, plus a fraction b of the overlap width B, according to the relationship Uo=G+b; b is preferably selected as 0.5 B. Therefore, the reference voltages Uref for the step n can be expressed as the general equation Urefn=An−1+G+b.

The foregoing refers to the incrementing of the output variable A. With decrementing the output variable A, the reference voltages Uref must be switched over. This is shown symbolically in FIG. 8 through the bypassing of the voltage source by the variable G, which is controlled by the microprocessor 1 via the line I/D. The reference voltages during decrementing, therefore, result in Urefn=An−1+b for the step n, i.e. they are the same level as the reference voltages of the preceding step (n−1) during incrementing.

I claim:

1. Apparatus for generating offset values for linearizing nonlinearities produced by the upper N more significant bits (MSB's) of an M-bit digital-to-analog converter, M and N being integers with M>N, said digital-to-analog converter including an N-bit upper MSB digital-to-analog converter and an (M−N)-bit lower LSB digital-to-analog converter, each having a respective analog output terminal coupled to an analog signal summing means for providing said digital-to-analog converter output values, said apparatus comprises:

comparing means for comparing analog output values provided by said analog signal summing means with threshold values;

threshold value generating means including a source of constant potential having a value substantially equal to the analog difference represented by one unit change of said MSB's plus a predetermined value (b); and means for serially coupling said source of constant potential between an input of said comparing means and the analog output terminal of said upper MSB digital-to-analog converter;

control means arranged for 1) providing respective MSB values, and for ones of such MSB values, incrementing said LSB values to provide consecutive values substantially over the range said M−N LSB's may represent; and 2) for storing, responsive to said comparing means, respective LSB values occurring when output signal provided by said digital-to-analog converter crosses a respective threshold value; and 3) for subtracting pairs of said stored LSB values corresponding to successive values exhibited by said MSB's to provide differences corresponding to said offset values.

* * * * *